United States Patent
Szeremeta

(10) Patent No.: US 8,390,952 B1
(45) Date of Patent: Mar. 5, 2013

(54) INFORMATION STORAGE DEVICE HAVING A CONDUCTIVE SHIELD WITH A PERIPHERAL CAPACITIVE FLANGE

(75) Inventor: Wally Szeremeta, Mission Viejo, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 900 days.

(21) Appl. No.: 12/036,106

(22) Filed: Feb. 22, 2008

(51) Int. Cl.
*G11B 33/14* (2006.01)
*G11B 33/12* (2006.01)
*H05K 9/00* (2006.01)

(52) U.S. Cl. .................................... 360/97.21; 361/816

(58) Field of Classification Search ............... 360/97.12, 360/97.21, 99.15, 99.18, 97.01–97.03; 361/679.33–679.39, 800, 816
See application file for complete search history.

(56) References Cited

U.S. PATENT DOCUMENTS

| | | | |
|---|---|---|---|
| 4,713,714 A | 12/1987 | Gatti et al. | |
| 4,831,476 A | 5/1989 | Branc et al. | |
| 5,041,924 A | 8/1991 | Blackborow et al. | |
| 5,062,016 A | 10/1991 | Zupancic | |
| 5,067,041 A | 11/1991 | Cooke et al. | |
| 5,124,855 A | 6/1992 | Dew et al. | |
| 5,187,621 A * | 2/1993 | Tacklind | 360/97.02 |
| 5,216,582 A | 6/1993 | Russell et al. | |
| 5,223,996 A | 6/1993 | Read et al. | |
| 5,243,495 A | 9/1993 | Read et al. | |
| 5,349,486 A | 9/1994 | Sugimoto et al. | |
| 5,455,728 A * | 10/1995 | Edwards et al. | 360/256.2 |
| 5,463,527 A | 10/1995 | Hager et al. | |
| 5,511,055 A | 4/1996 | Otsuki et al. | |
| 5,544,142 A * | 8/1996 | Funakiri | 720/650 |
| 5,586,893 A | 12/1996 | Mosquera | |
| 5,600,509 A * | 2/1997 | Kawakami | 360/97.02 |
| 5,654,875 A | 8/1997 | Lawson | |
| 5,694,267 A | 12/1997 | Morehouse et al. | |
| 5,777,821 A | 7/1998 | Pottebaum | |
| 5,870,247 A | 2/1999 | Schirle | |
| 6,018,125 A | 1/2000 | Collins et al. | |
| 6,147,834 A | 11/2000 | Srikrishna et al. | |
| 6,185,097 B1 | 2/2001 | Behl | |

(Continued)

FOREIGN PATENT DOCUMENTS

| | | | |
|---|---|---|---|
| JP | 2000163947 A | * | 6/2000 |
| JP | 2000163947 | | 6/2010 |

OTHER PUBLICATIONS

Peter A. Masterson, "Isolation Techniques for 2.5-Inch Hard Disk Drives", www.earshockandvibe.com/pdfs/engineering/2.5HDD.pdf, downloaded on Dec. 10, 2007, 4 pages.

(Continued)

*Primary Examiner* — Will J Klimowicz

(57) ABSTRACT

A novel information storage device is disclosed and claimed. The information storage device includes a disk drive having a disk drive top surface, a disk drive bottom surface, a disk drive periphery, and a disk drive printed circuit board. The disk drive defines a Z direction that is normal to the disk drive top surface. The disk drive defines a disk drive height measured in the Z direction from the disk drive bottom surface to the disk drive top surface. The information storage device includes a first conductive shield over the disk drive. The first conductive shield includes a peripheral capacitive flange that at least partially overlaps the disk drive periphery. The peripheral capacitive flange is separated from the disk drive periphery in a direction normal to the Z direction by a clearance. The overlap in the Z-direction is at least 5 times the clearance.

6 Claims, 4 Drawing Sheets

U.S. PATENT DOCUMENTS

| | | | |
|---|---|---|---|
| 6,252,770 B1 | 6/2001 | Yu et al. | |
| 6,275,352 B1 | 8/2001 | Tadepalli et al. | |
| 6,285,545 B1 | 9/2001 | Lopez | |
| 6,292,373 B1 | 9/2001 | Li et al. | |
| 6,319,026 B1 | 11/2001 | Chen et al. | |
| 6,354,875 B1 | 3/2002 | Wu | |
| 6,407,913 B1 | 6/2002 | Peachey et al. | |
| 6,411,522 B1 | 6/2002 | Frank, Jr. et al. | |
| 6,437,980 B1 | 8/2002 | Casebolt | |
| 6,462,958 B2 | 10/2002 | Ogata | |
| 6,469,864 B2 * | 10/2002 | Kamezawa et al. | 360/97.01 |
| 6,480,380 B1 | 11/2002 | French et al. | |
| 6,487,039 B1 | 11/2002 | Bernett | |
| 6,498,722 B1 | 12/2002 | Stolz et al. | |
| 6,535,384 B2 | 3/2003 | Huang | |
| 6,538,886 B2 | 3/2003 | Yu | |
| 6,561,836 B1 | 5/2003 | Marshall et al. | |
| 6,567,265 B1 | 5/2003 | Yamamura et al. | |
| 6,567,360 B1 | 5/2003 | Kagawa | |
| 6,593,673 B1 | 7/2003 | Sugai et al. | |
| 6,618,246 B2 | 9/2003 | Sullivan et al. | |
| 6,621,693 B1 | 9/2003 | Potter et al. | |
| 6,621,717 B2 | 9/2003 | Tuttle et al. | |
| 6,661,651 B1 | 12/2003 | Tanzer et al. | |
| 6,661,677 B1 | 12/2003 | Rumney | |
| 6,735,080 B1 | 5/2004 | Chang | |
| 6,751,092 B1 | 6/2004 | Ohnishi et al. | |
| 6,752,654 B1 | 6/2004 | Huang et al. | |
| 6,758,685 B1 | 7/2004 | Huang et al. | |
| 6,761,580 B2 | 7/2004 | Chang | |
| 6,781,826 B1 | 8/2004 | Goldstone et al. | |
| 6,790,066 B1 | 9/2004 | Klein | |
| 6,811,427 B2 | 11/2004 | Garrett et al. | |
| 6,843,674 B1 | 1/2005 | Young | |
| 6,958,884 B1 | 10/2005 | Ojeda et al. | |
| D512,422 S | 12/2005 | Sato et al. | |
| 7,035,097 B2 | 4/2006 | Petrov et al. | |
| D521,935 S | 5/2006 | Lai | |
| D521,936 S | 5/2006 | Novotney et al. | |
| D538,233 S | 3/2007 | Wan et al. | |
| 7,187,543 B2 | 3/2007 | Zimlin | |
| 7,211,739 B1 | 5/2007 | Brigham, Jr. et al. | |
| 7,271,978 B1 | 9/2007 | Santini et al. | |
| 7,298,583 B2 * | 11/2007 | Miyazaki et al. | 360/97.01 |
| 7,307,843 B2 | 12/2007 | Harman et al. | |
| 7,630,168 B2 * | 12/2009 | Abe et al. | 360/97.02 |
| 7,701,705 B1 | 4/2010 | Szeremeta | |
| 8,004,791 B2 | 8/2011 | Szeremeta et al. | |
| 2003/0043499 A1 * | 3/2003 | Shimomura et al. | 360/97.01 |
| 2003/0179489 A1 * | 9/2003 | Bernett et al. | 360/97.01 |
| 2003/0206402 A1 | 11/2003 | Tsuyuki et al. | |
| 2004/0255313 A1 | 12/2004 | Kaczeus, Sr. et al. | |
| 2005/0030712 A1 | 2/2005 | Faneuf et al. | |
| 2005/0063155 A1 | 3/2005 | Endo et al. | |
| 2005/0088778 A1 | 4/2005 | Chen et al. | |
| 2005/0185326 A1 | 8/2005 | Bruner et al. | |
| 2005/0205279 A1 | 9/2005 | Cochrane | |
| 2005/0215084 A1 | 9/2005 | Ho et al. | |
| 2006/0002005 A1 * | 1/2006 | Miyazaki et al. | 360/97.01 |
| 2006/0072240 A1 * | 4/2006 | Eguchi et al. | 360/97.01 |
| 2006/0158775 A1 | 7/2006 | Sega et al. | |
| 2006/0289191 A1 | 12/2006 | Yamashita | |
| 2007/0091567 A1 | 4/2007 | Hayashi | |
| 2007/0149029 A1 | 6/2007 | Hwang | |
| 2008/0123218 A1 * | 5/2008 | Li et al. | 360/97.01 |
| 2008/0165489 A1 | 7/2008 | Ho et al. | |

OTHER PUBLICATIONS

"3M Mini Serial Attached SCSI (miniSAS) Connector", 8A26/8C26 Series, Sep. 2007, TS-2211-B, 9 pages.

"3M Mini Serial Attached SCSI (miniSAS) Connector/Shell", 8A36/8B36 Series, Feb. 2007, TS-2219-01, 7 pages.

Serial ATA; from Wikipedia, excerpted Nov. 1, 2011, 17 pages.

* cited by examiner

INFORMATION STORAGE DEVICE HAVING A CONDUCTIVE SHIELD WITH A PERIPHERAL CAPACITIVE FLANGE

BACKGROUND OF THE INVENTION

1. Field of the Invention

The present invention relates generally to the field of information storage devices, and more particularly to mounting systems and housings for information storage devices.

2. Background of the Art

Information storage devices are used to retrieve and/or store data for computer systems and other consumer electronics products. A magnetic hard disk drive is an example of an information storage device. Many information storage devices, including magnetic hard disk drives, are sensitive to their external environment, including mechanical shocks, externally applied forces and electromagnetic fields, contamination, changes in temperature and/or humidity, etc. Therefore, an information storage device's housing and mounting system may affect its performance, reliability, and lifetime.

Many information storage devices are housed within the system for which they retrieve and/or store data. For example, so-called "internal" disk drives are housed within a host computer system for which they store data, and therefore internal disk drives may take advantage of the host computer system for electrical power, electromagnetic shielding, convective and/or conductive cooling, vibration dampening, some degree of isolation from external mechanical shocks, etc.

Other information storage devices are not housed within the system for which they retrieve and/or store data. For example, a so-called "external" hard disk drive includes its own housing, which may provide electromagnetic shielding, vibration dampening, some degree of isolation from external mechanical shocks, and active or passive cooling.

The mounting systems and housings for modern information storage devices must often meet challenging space and cost requirements. Accordingly, there is an ongoing need in the art for improved mounting systems and housings for information storage devices.

SUMMARY

A novel information storage device is disclosed and claimed. The information storage device includes a disk drive having a disk drive top surface, a disk drive bottom surface, a disk drive periphery, and a disk drive printed circuit board. The disk drive defines a Z direction that is normal to the disk drive top surface. The disk drive defines a disk drive height measured in the Z direction from the disk drive bottom surface to the disk drive top surface. The information storage device includes a first conductive shield over the disk drive. The first conductive shield includes a peripheral capacitive flange that at least partially overlaps the disk drive periphery. The peripheral capacitive flange is separated from the disk drive periphery in a direction normal to the Z direction by a clearance. The overlap in the Z-direction is at least 5 times the clearance.

DETAILED DESCRIPTION OF EXEMPLARY EMBODIMENTS

Figure 1:
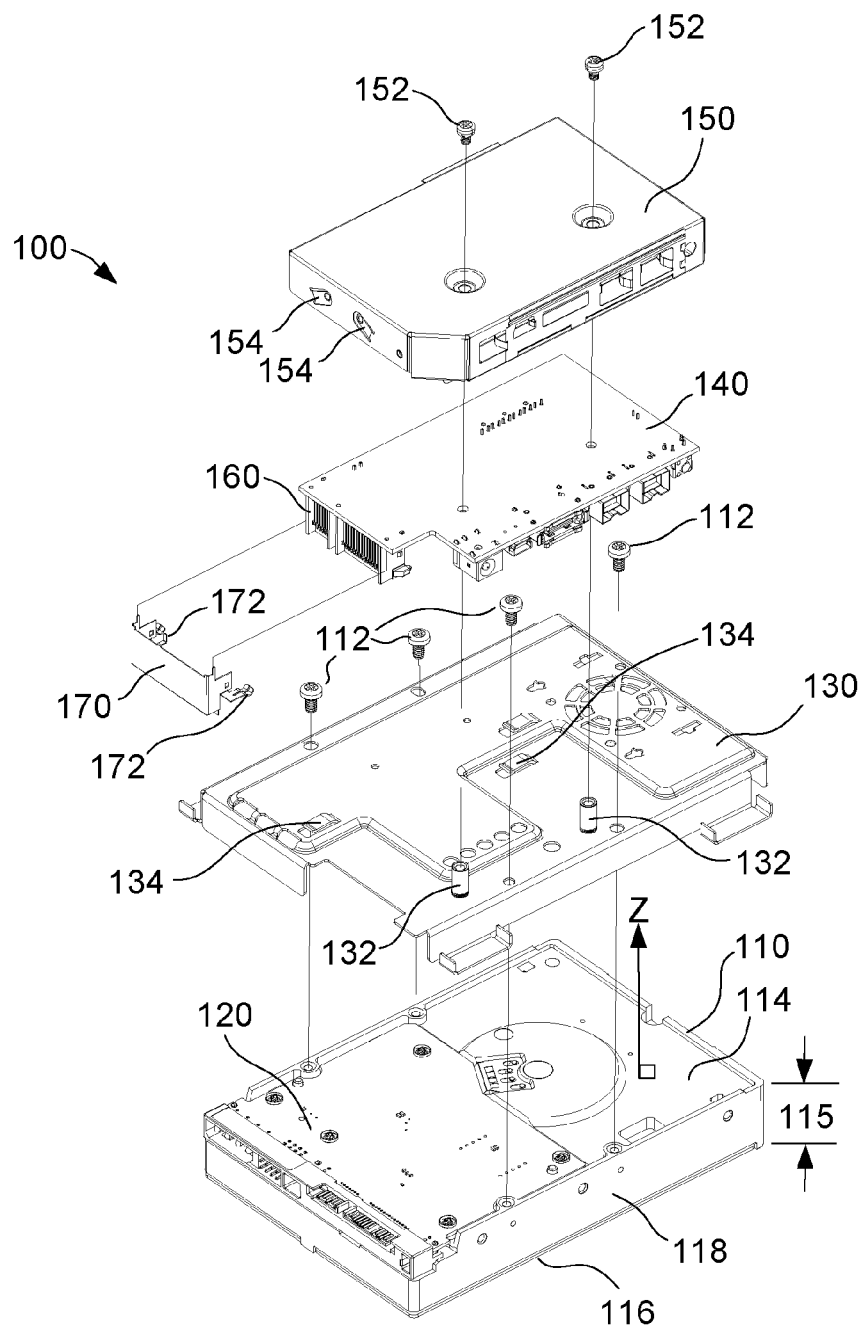
FIG. 1 is an exploded perspective view of an information storage device according to an embodiment of the present invention.

A novel information storage device is disclosed and claimed. FIG. 1 is an exploded perspective view of an information storage device 100 according to an embodiment of the present invention. The information storage device 100 includes a disk drive 110, a disk drive printed circuit board 120, and a first conductive shield 130 over the disk drive printed circuit board 120 and attached to the disk drive 110 by screws 112. The disk drive printed circuit board 120 may include disk drive controller circuitry to control the rotation of a spindle motor within the disk drive 110 and the motion of an actuator within the disk drive 110. To reduce manufacturing costs, the first conductive shield 130 is preferably fabricated from sheet metal.

Disk drive 110 includes a disk drive top surface 114, a disk drive bottom surface 116, and a disk drive periphery 118. The disk drive 110 defines a Z direction (normal to the disk drive top surface 114) and the disk drive 110 defines a disk drive height 115 measured in the Z direction from the disk drive bottom surface 116 to the disk drive top surface 114. The disk drive 110 may be of various form factors and the form factor substantially determines the disk drive height 115. For example, disk drive 110 may be a 3.5" form-factor disk drive and have a disk drive height 115 of approximately 25 mm. Also for example, disk drive 110 may be a 2.5" form factor disk drive and have a disk drive height of approximately 9.5 mm.

The size of the disk drive printed circuit board 120 and of the disk drive 110 may affect various aspects of the design of the first conductive shield 130. For example, the first conductive shield 130 is preferably large enough to substantially cover the disk drive printed circuit board 120 to provide adequate electromagnetic shielding. Also for example, the thickness of sheet metal from which the first conductive shield 130 may be fabricated, may be scaled according to disk drive form factor. For example in the embodiment of FIG. 1, if the disk drive 110 is a 3.5" form-factor magnetic hard disk drive, then a corresponding sheet metal thickness is preferably in the range 0.8 mm to 1.6 mm. Also for example, if the disk drive 110 is a 2.5" form-factor magnetic hard disk drive, then a corresponding sheet metal thickness is preferably in the range 0.4 mm to 1.2 mm.

The information storage device 100 of FIG. 1 also includes a bridge controller printed circuit board 140 and a second conductive shield 150 over and electrically coupled to the bridge controller printed circuit board 140. The bridge controller printed circuit board 140 may, for example, be a Serial Advanced Technology Attachment (SATA) controller printed circuit board that includes circuitry to control a SATA interface. The bridge controller printed circuit board 140 may, for example, enable the information storage device 100 to transfer data to/from a separate computer system over a Universal Serial Bus (USB) connection.

In the embodiment of FIG. 1, the first conductive shield 130 and the second conductive shield 150 are shown to be in direct contact with each other and also to be attached to each other via screws 152 and spacers 132. Also in the embodiment of FIG. 1, the first conductive shield 130 includes conductive tabs 134 that contact and can help retain the second conductive shield 150.

In the embodiment of FIG. 1, a disk drive interface connector 160 electrically couples the bridge controller printed circuit board 140 with the disk drive printed circuit board 120. For example, the disk drive interface connector 160 may be a high-rise SATA connector. Preferably the disk drive interface connector 160 does not include any cable. Preferably the disk drive interface connector 160 does not protrude from the disk drive 110 more than 6 mm in any direction.

In the embodiment of FIG. 1, a third conductive shield 170 is attached to the disk drive interface connector 160 and, after assembly, is in direct contact with both the first conductive shield 130 and second conductive shield 150. The third conductive shield 170 may be fabricated from stainless steel, for example. In the embodiment of FIG. 1, the direct contact between the third conductive shield 170 and the first conductive shield 130 is provided by conductive protrusions 172 that extend from the third conductive shield 170. Considering manufacturing tolerances, the electrical reliability of the direct contact between the third conductive shield 170 and the second conductive shield 150 may be enhanced by the travel of conductive tabs 154 that pertain to the second conductive shield 150 in the embodiment of FIG. 1.

Figure 2:
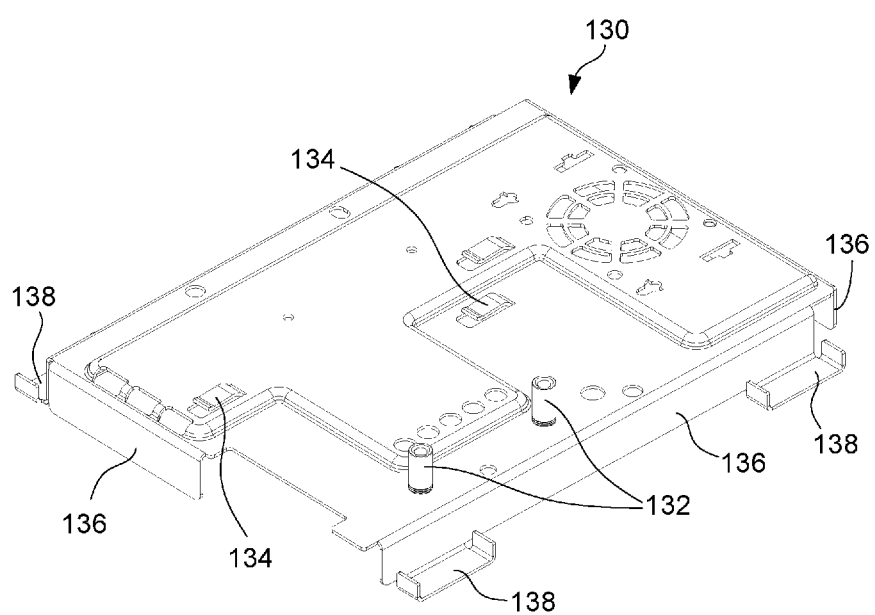
FIG. 2 depicts a first conductive shield according to an embodiment of the present invention.
Figure 3:
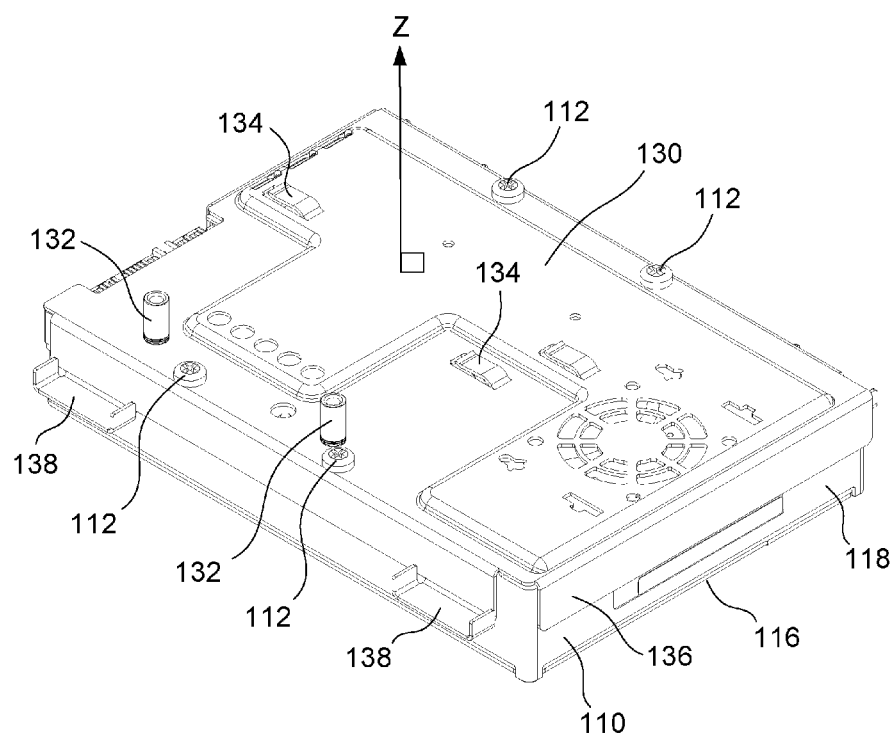
FIG. 3 depicts the first conductive shield of FIG. 2, as coupled to a disk drive according to an embodiment of the present invention.

FIG. 2 shows a closer perspective view of the first conductive shield 130, and FIG. 3 shows the first conductive shield 130 coupled to the disk drive 110, according to an embodiment of the present invention. In the embodiment of FIGS. 2 and 3, the first conductive shield 130 includes peripheral capacitive flanges 136, each of which at least partially overlaps the disk drive periphery 118. To accommodate manufacturing tolerances, the peripheral capacitive flanges 136 are designed to be separated from the disk drive periphery 118 in a direction normal to the Z direction by a clearance. For example, if the disk drive 110 is a 3.5" form factor disk drive, then the clearance may be in the range 0.5 mm to 5.1 mm. Also for example, if the disk drive 110 is a 2.5" form factor disk drive, then the clearance may be in the range 0.5 mm to 2 mm.

Preferably, each peripheral capacitive flange 136 is dimensioned to overlap the disk drive periphery 118 in the Z-direction by at least 5 times the clearance. For example, if the disk drive 110 is a 3.5" form-factor disk drive, the overlap is preferably at least 2.5 mm but preferably no more than 25.4 mm measured in the Z direction. Also for example, if the disk drive 110 is a 2.5" form-factor disk drive, the overlap is preferably at least 2.5 mm but preferably no more than 10 mm measured in the Z direction. Such overlap may provide a desirable level of capacitive electrical coupling between the first conductive shield 130 and the disk drive 110, in lieu of or in addition to direct electrical coupling via screws 112. The peripheral capacitive flanges 136 may also include a plurality of projections 138 for mounting the disk drive 110 and its conductive shields into an exterior housing.

Figure 4:
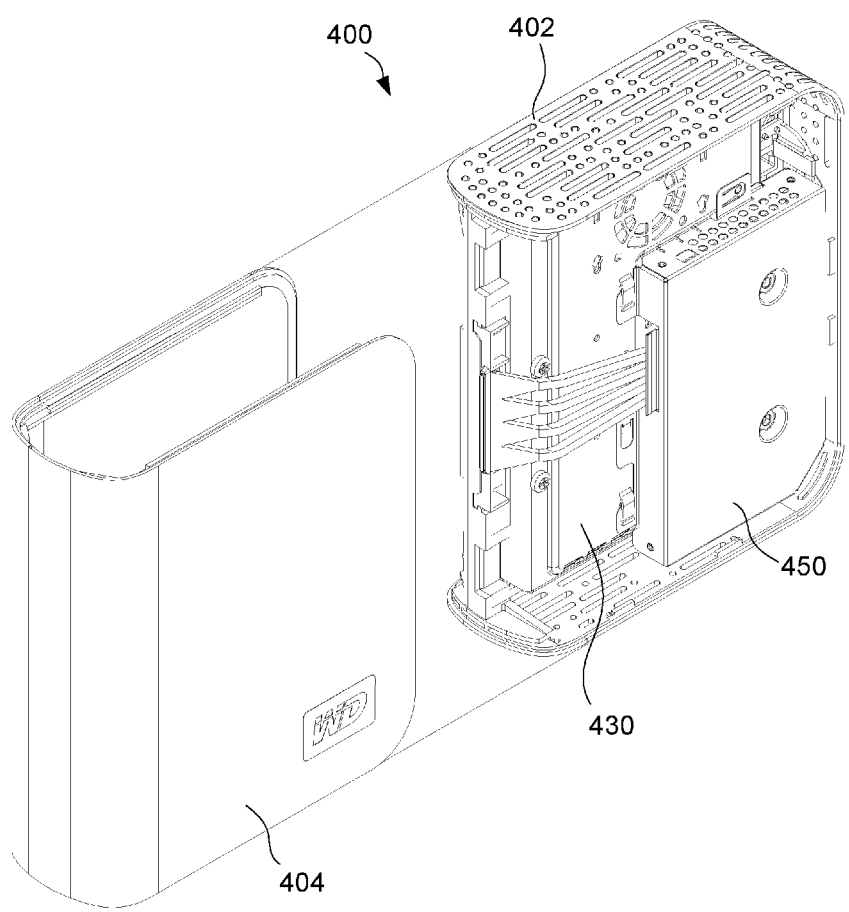
FIG. 4 depicts a partially exploded view of an information storage device according to an embodiment of the present invention.

FIG. 4 is a partially exploded view of an information storage device 400, according to an embodiment of the present invention. The information storage device 400 includes a housing 402 and a cover 404. The housing 402 and the cover 404 may comprise injection molded plastic, for example. First conductive shield 430 and second conductive shield 450 of this embodiment are visible in FIG. 4.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. "Comprising," "including," and "having," are intended to be open-ended terms.

What is claimed is:

1. An information storage device comprising:
a disk drive including a disk drive top surface, a disk drive bottom surface, a disk drive periphery, and a disk drive printed circuit board, the disk drive defining a Z direction that is normal to the disk drive top surface, the disk drive defining a disk drive height measured in the Z direction from the disk drive bottom surface to the disk drive top surface;
a first conductive shield over the disk drive, the first conductive shield comprising sheet metal having a thickness in the range 0.4 mm to 1.6 mm and being directly electrically connected to the disk drive, the first conductive shield including a peripheral capacitive flange that at least partially overlaps the disk drive periphery, the peripheral capacitive flange being separated from the disk drive periphery in a direction normal to the Z direction by a clearance, wherein the overlap in the Z-direction is at least 5 times the clearance, and there is no solid layer between the peripheral capacitive flange and the disk drive periphery.

2. The information storage device of claim 1 wherein the disk drive is a 2.5" form-factor disk drive and the overlap is at least 2.5 mm but no more than 10 mm measured in the Z direction.

3. The information storage device of claim 1 wherein the disk drive is a 3.5" form-factor disk drive and the overlap is at least 2.5 mm but no more than 25.4 mm measured in the Z direction.

4. The information storage device of claim 1 wherein the disk drive is a 2.5" form-factor disk drive, and wherein the first conductive shield comprises sheet metal having a thickness in the range 0.4 mm to 1.2 mm.

5. The information storage device of claim 1 wherein the disk drive is a 3.5" form-factor disk drive, and wherein the first conductive shield comprises sheet metal having a thickness in the range 0.8 mm to 1.6 mm.

6. The information storage device of claim 1 wherein the peripheral capacitive flange consists of sheet metal having a thickness in the range 0.4 mm to 1.6 mm.

* * * * *